United States Patent
Knychalski et al.

(10) Patent No.: US 12,075,592 B2
(45) Date of Patent: Aug. 27, 2024

(54) MODULAR CABLE MANAGEMENT DEVICE

(71) Applicant: Ortronics, Inc., New London, CT (US)

(72) Inventors: Thomas Knychalski, Providence, RI (US); Ryan J. Grandidge, Kingstown, RI (US); Daniel M. Smith, Westerly, RI (US); Michael J. Moldoch, Colchester, CT (US)

(73) Assignee: Legrand DPC, LLC, West Hartford, CT (US)

( * ) Notice: Subject to any disclaimer, the term of this patent is extended or adjusted under 35 U.S.C. 154(b) by 85 days.

(21) Appl. No.: 17/830,960

(22) Filed: Jun. 2, 2022

(65) Prior Publication Data

US 2023/0397359 A1    Dec. 7, 2023

(51) Int. Cl.
*H05K 7/14*      (2006.01)
*F16L 3/127*     (2006.01)

(52) U.S. Cl.
CPC .................. *H05K 7/1491* (2013.01)

(58) Field of Classification Search
CPC .......... H05K 7/1491; F16L 3/127; H02G 3/32
USPC .......................................... 248/68.1; 361/826
See application file for complete search history.

(56) References Cited

U.S. PATENT DOCUMENTS

| | | | | |
|---|---|---|---|---|
| 4,131,257 A | * | 12/1978 | Sterling | F16L 3/2235 248/68.1 |
| 5,992,802 A | * | 11/1999 | Campbell | H02G 3/30 248/68.1 |
| 6,489,565 B1 | * | 12/2002 | Krietzman | H02G 3/045 174/101 |
| 6,889,944 B2 | * | 5/2005 | Brandzel | H02G 3/32 248/65 |
| 6,946,605 B2 | * | 9/2005 | Levesque | H05K 7/1491 248/68.1 |
| 7,697,811 B2 | | 4/2010 | Murano et al. | |
| RE41,353 E | * | 5/2010 | McGrath | H04Q 1/068 379/327 |
| 7,857,670 B2 | * | 12/2010 | McGrath | H05K 7/186 439/701 |
| 7,983,038 B2 | | 7/2011 | Levesque et al. | |
| 8,106,311 B2 | | 1/2012 | Larsen et al. | |
| 8,184,938 B2 | | 5/2012 | Cooke et al. | |
| 8,398,039 B2 | | 3/2013 | Murano et al. | |
| 8,439,702 B2 | | 5/2013 | Dietz et al. | |
| 8,672,709 B2 | | 3/2014 | Dietz et al. | |
| 8,731,364 B2 | | 5/2014 | Murano et al. | |

(Continued)

OTHER PUBLICATIONS

Search Report from related European Patent Application No. 23176277.4 issued Oct. 30, 2023.

*Primary Examiner* — Anita M King
(74) *Attorney, Agent, or Firm* — McCarter & English, LLP

(57) ABSTRACT

An example modular cable management device for a media patching system is provided. The device includes a body defining a top surface, a bottom surface opposing the top surface, a front side, and a rear side opposing the front side. The device includes an opening formed in the body at the bottom surface and extending into the body. The opening includes features for engagement with a fastener for detachable coupling of the body to the media patching system. The device includes extensions protruding from the front side of the body. The extensions define one or more spaces therebetween for receipt of cables associated with the media patching system.

19 Claims, 9 Drawing Sheets

(56) References Cited

U.S. PATENT DOCUMENTS

| | | |
|---|---|---|
| 8,758,047 B2 | 6/2014 | Dietz et al. |
| 8,882,051 B2 * | 11/2014 | Bleus .................. H02G 3/30 |
| | | 248/68.1 |
| 9,212,765 B1 | 12/2015 | Chia et al. |
| 9,606,317 B2 | 3/2017 | Grandidge et al. |
| 9,784,936 B2 | 10/2017 | Grandidge et al. |
| 9,997,899 B2 | 6/2018 | Grandidge et al. |
| 10,859,782 B2 | 12/2020 | Grundwald et al. |
| 11,346,466 B2 * | 5/2022 | Marcinkowski ......... F16L 3/015 |
| 11,641,095 B2 * | 5/2023 | Hüppi-Ziegler ..... H02G 3/0406 |
| | | 248/68.1 |
| 2010/0133391 A1 | 6/2010 | Taylor |
| 2012/0273627 A1 | 11/2012 | Fritz et al. |
| 2015/0364876 A1 | 12/2015 | Grandidge et al. |

* cited by examiner

MODULAR CABLE MANAGEMENT DEVICE

BACKGROUND

Media patching systems are used in the telecommunications industry for interconnectivity of a variety of connectors. As the density of media patching systems increases, the number of cables passing into and out of media patching systems also increases. Cable management clips have been used in the industry to assist with guiding and/or holding cables in the desired position to provide improved access to the front of the media patching system. Traditional cable management clips typically snap into complementary openings in the base of the media patching system. In some instances, such snapping engagement of traditional cable management clips with the base of the media patching system may result in undesired movement and/or wobble of the clips during use. Over time, the undesired movement and/or wobble can lead to disengagement of the clips from the media patching system.

SUMMARY

Embodiments of the present disclosure provide an exemplary modular cable management device. The device includes complementary keying features that allow for secure engagement of the device to a base of a media patching system. Such secure engagement ensures that undesired movement of the device relative to the media patching system is prevented, resulting in secure, releasable guiding and holding of cables associated with the media patching system. The keying features of the device further allow multiple devices to be stacked and coupled relative to each other, resulting in an assembly that structurally acts as a single construction component. The devices can therefore be interchanged and/or stacked as needed depending on the needs of the user, allowing for customization in the field.

In accordance with embodiments of the present disclosure, an exemplary modular cable management device for a media patching system is provided. The modular cable management device includes a body defining a top surface, a bottom surface opposing the top surface, a front side, and a rear side opposing the front side. The modular cable management device includes an opening formed in the body at the bottom surface and extending into the body. The opening includes features for engagement with a fastener for detachable coupling of the body to the media patching system. The modular cable management device includes extensions protruding from the front side of the body. The extensions define one or more spaces therebetween for passage of one or more cables into the spaces.

In some embodiments, the opening can extend entirely through the body from the bottom surface to the top surface. In some embodiments, the features for engagement can include an insert disposed within the opening at or near the bottom surface of the body. The insert can include a threaded opening with threads complementary to threads of the fastener for detachable coupling of the body to the media patching system.

In some embodiments, the body can include a recessed section formed in the bottom surface of the body. A central longitudinal axis of the recessed section is aligned with a central longitudinal axis of the opening formed in the body. In some embodiments, the recessed section can define a hexagonal configuration. In some embodiments, the body can include a first keying feature extending from the top surface of the body. A central longitudinal axis of the first keying feature is aligned with a central longitudinal axis of the opening formed in the body. In some embodiments, the first keying feature can define a hexagonal extension. The first keying feature can be complementary to the recessed section.

In some embodiments, the extensions can include a first extension protruding perpendicularly from the front side of the body at or near the top surface of the body, and a second extension protruding perpendicularly from the front side of the body at or near the bottom surface of the body. In some embodiments, the device can include a second keying feature extending perpendicularly from a bottom surface of the second extension. In some embodiments, the second keying feature can define an elongated, rectangular shape configured to be received by a complementary slot in the media patching system. In some embodiments, the device can include an elongated slot formed in a top surface of the first extension. The elongated slot can be complementary to the second keying feature.

In some embodiments, the extensions can include a third extension and a fourth extension protruding perpendicularly from the front side of the body in a spaced manner relative to the first and second extensions. In some embodiments, each of the extensions can include a flange at a proximal end oriented perpendicularly relative to the extensions. The flanges can define an adjustable gap therebetween (e.g., based on flexing of the respective extensions away from each other) for passage of cables associated with the media patching system.

In accordance with embodiments of the present disclosure, an exemplary modular cable management system is provided. The modular cable management system includes a media patching system including a base. The base includes an opening and a slot formed therein. The modular cable management system includes a first modular cable management device capable of being detachably coupled to the base of the media patching system. The modular cable management device includes a body defining a top surface, a bottom surface opposing the top surface, a front side, and a rear side opposing the front side. The modular cable management device includes an opening formed in the body at the bottom surface and extending into the body. The modular cable management device includes extensions protruding from the front side of the body, the extensions defining one or more spaces therebetween.

In some embodiments, the opening of the first modular cable management device includes features for engagement with a fastener for detachable coupling of the body to the media patching system. In some embodiments, the system can include a second modular cable management device stacked on the first modular cable management device. The second modular cable management device includes a body and an opening formed in the body at a bottom surface of the second modular cable management device. The opening extends into the body of the second modular cable management device. In the stacked configuration, the opening of the second modular cable management device can be aligned with the opening of the first cable management device. The system can include a fastener extending through the opening of the media patching system, extending through the opening in the first modular cable management device, and at least partially extending into the opening in the second modular cable management device. The fastener can be engaged with features within the opening in the second modular cable management device to couple the first and second modular cable management devices to each other and to the media patching system.

In accordance with embodiments of the present disclosure, an exemplary method of cable management on a media patching system is provided. The method includes positioning a modular cable management device on a base of a media patching system. The media patching system includes an opening formed therein. The modular cable management device includes a body defining a top surface, a bottom surface opposing the top surface, a front side, and a rear side opposing the front side. The modular cable management device includes an opening formed in the body at the bottom surface and extending into the body. The modular cable management device includes extensions protruding from the front side of the body. The extensions define one or more spaces therebetween. The method includes extending a fastener through the opening formed in the media patching system and into the opening formed in the body of the modular cable management device. The method includes engaging features within the opening formed in the body of the modular cable management device with the fastener to detachably couple the modular cable management device to the base of the media patching system.

Any combination and/or permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

To assist those of skill in the art in making and using the modular cable management systems, reference is made to the accompanying figures, wherein.

DETAILED DESCRIPTION

Figure 1:
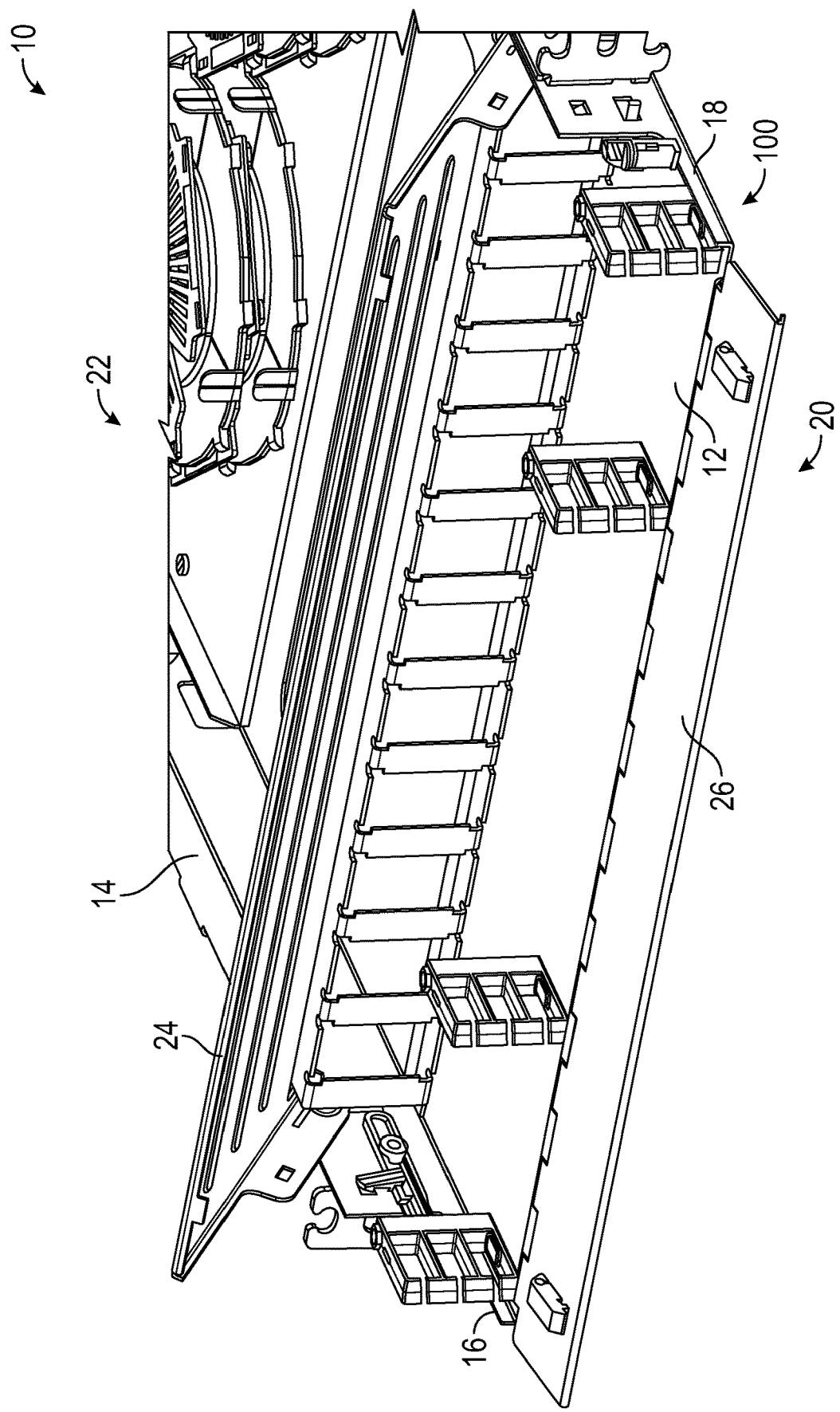
FIG. 1 is a perspective view of modular cable management devices detachably coupled to a media patching system in an exemplary embodiment.

FIG. 1 is a perspective view of a media patching system 10 (e.g., a patch panel, or the like) and exemplary modular cable management devices 100 (hereinafter "devices 100") detachably coupled to the media patching system 10. Media patching systems 10 generally include a housing formed by a base 12, a top 14, and side surfaces 16, 18 that extend between a front or proximal end 20 and a rear or distal end 22. The media patching system 10 can include a cover section 24 pivotably coupled relative to the top 14, and can include a front cover 26 pivotably coupled relative to the base 12.

The media patching system 10 can be configured to selectively receive multiple devices 100. For such detachable coupling of the devices 100 to the media patching system 10, the base 12 of the media patching system 10 can include complementary mounting features that assist with alignment and fixation of the device 100 to the base 12. For each mounting location on the base 12 capable of receive a device 100, the base 12 can include a pair of mounting/alignment features in the form of a hole or opening 28, and an elongated, rectangular keyhole or slot 30 (see, e.g., FIGS. 2-3). The opening 28 and slot 30 can be positioned adjacent to each other in a spaced manner, with the slot 30 positioned proximally of the opening 28. The slot 30 can extend lengthwise along an axis passing through the center of the opening 28 and extending from the proximal end 20 to the distal end 22 of the media patching system 10. In some embodiments, the opening 28 can be countersunk at the bottom surface of the base 12. Both the opening 28 and the slot 30 extend fully through the base 12.

Figure 2:
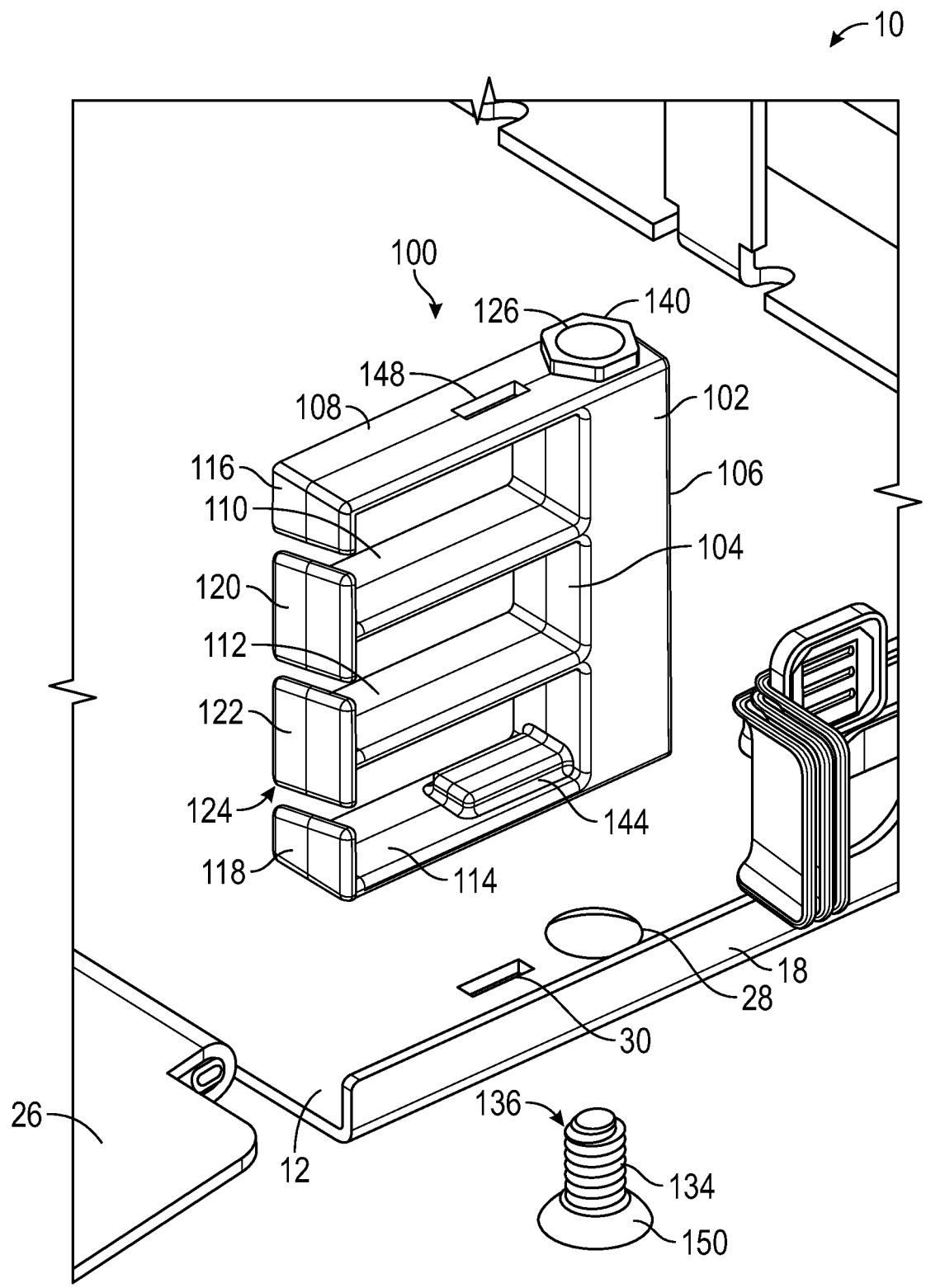
FIG. 2 is a top perspective, exploded view of a modular cable management device and a media patching system in an exemplary embodiment.
Figure 3:
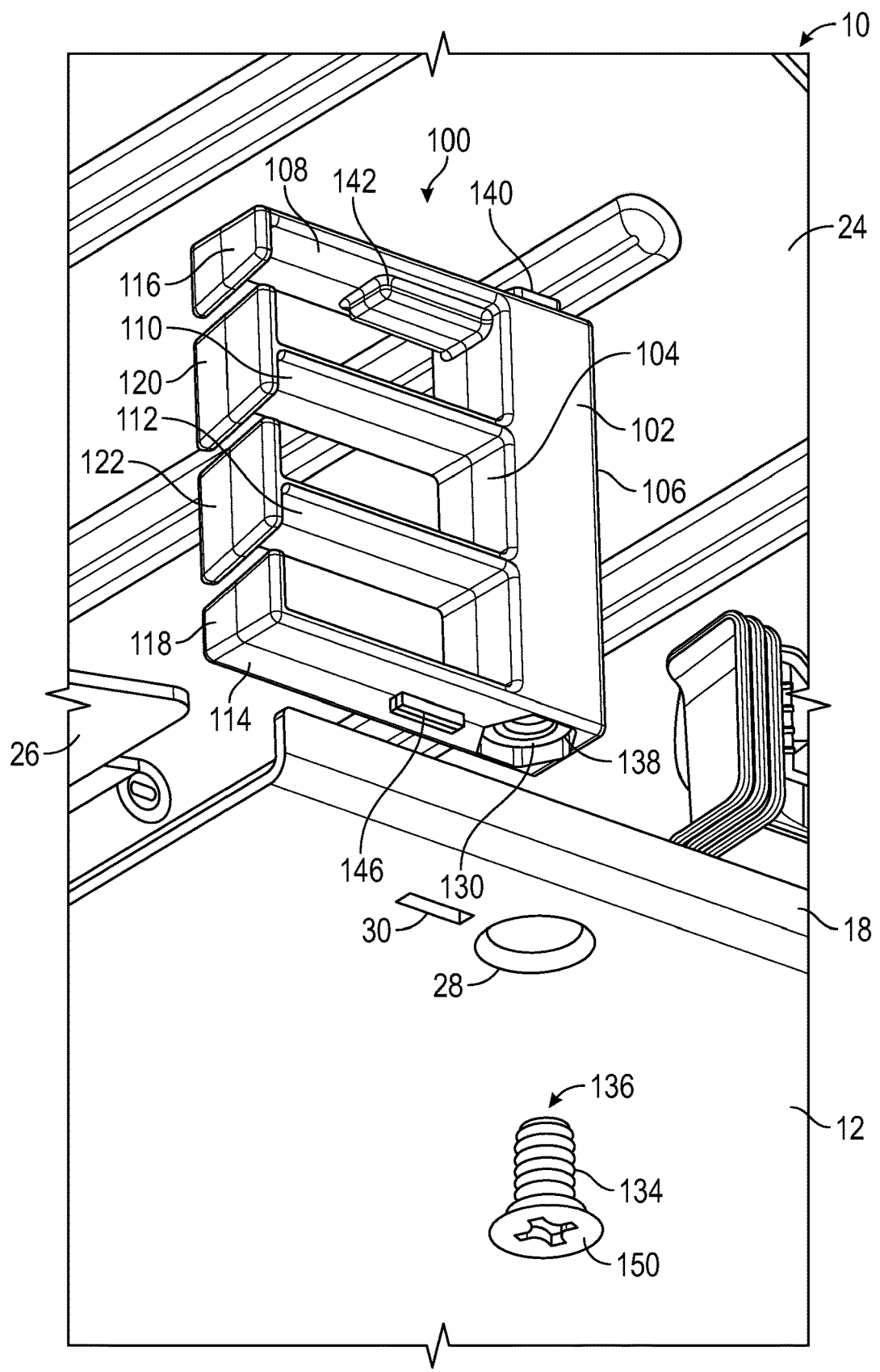
FIG. 3 is a bottom perspective, exploded view of a modular cable management device and a media patching system in an exemplary embodiment.
Figure 4:
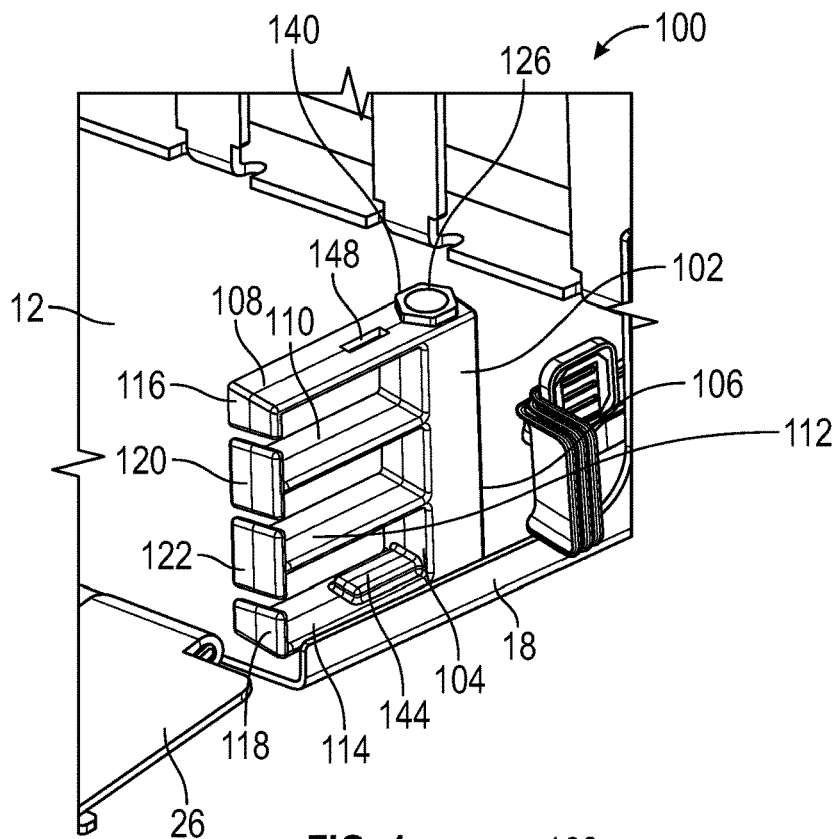
FIG. 4 is a top, perspective view of a modular cable management device detachably coupled to a media patching system in an exemplary embodiment.
Figure 5:
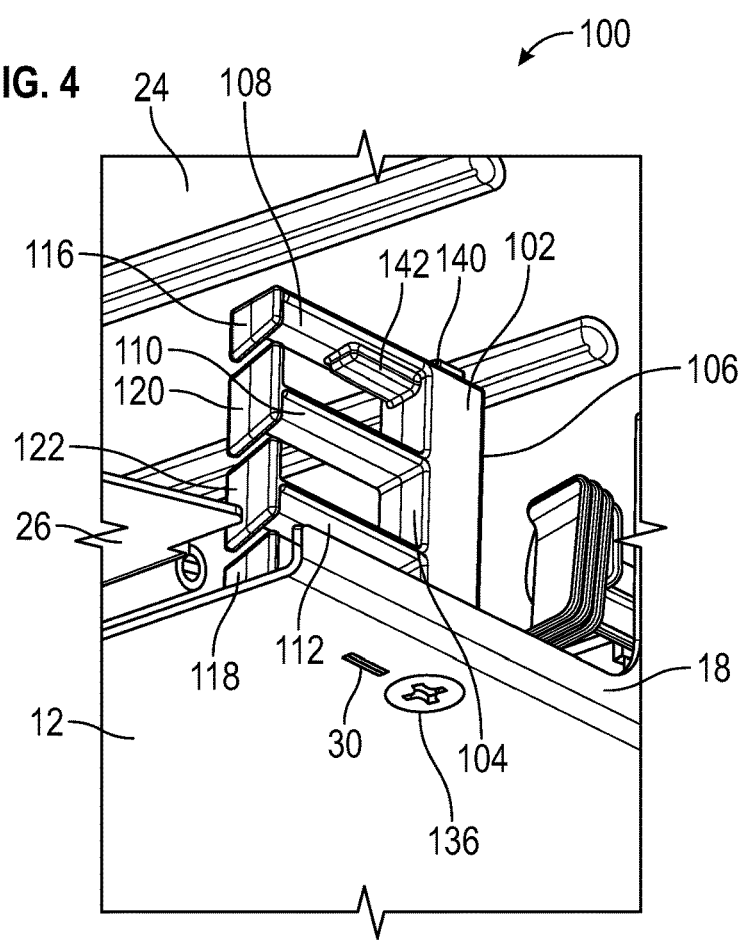
FIG. 5 is a bottom, perspective view of a modular cable management device detachably coupled to a media patching system in an exemplary embodiment.
Figure 6:
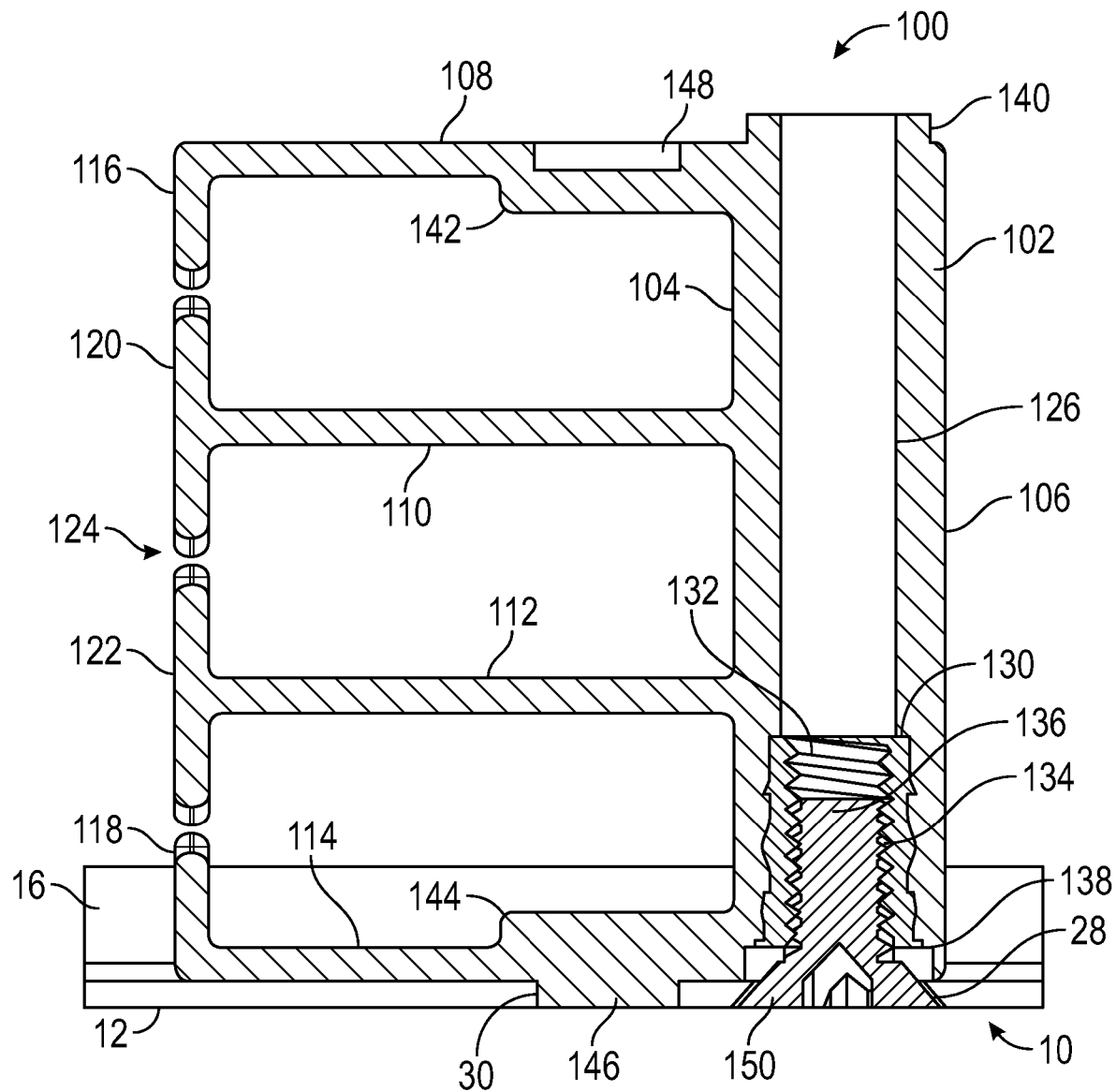
FIG. 6 is a cross-sectional side view of a modular cable management device detachably coupled to a media patching system in an exemplary embodiment.

FIGS. 2-3 are top and bottom perspective, exploded views of the device 100 prior to coupling with the media patching system 10, and FIGS. 4-5 are top and bottom perspective views of the device 100 detachably coupled to the media patching system 10. FIG. 6 is a cross-sectional side view of the device 100 detachably coupled to the media patching system 10. The device 100 can be in the form of an injection molded cable management loop or clip capable of receiving and guiding cables (not shown) connected to the media patching system 10.

With reference to each of FIGS. 2-6, the device 100 generally includes a body 102 defining a substantially rectangular post configuration. The body 102 is configured to be oriented in a substantially vertical or perpendicular orientation relative to the base 12 of the media patching system 10 when the device 100 is coupled to the media patching system 10. The body 102 includes substantially planar sides, including a proximal or front side 104 and an opposing distal or rear side 106. The device 100 includes multiple extensions 108, 110, 112, 114 protruding perpendicularly (or substantially perpendicularly) from the front side 104 of the body 102. Each extension 108-114 can define a width dimensioned substantially equal to the width of the body 102. The extension 108 can extend from and/or define the top surface of the body 102 and the extension 114 can extend from and/or define the opposing bottom surface of the body 102. The extension 110 is spaced from the extension 108 and the extension 110 is spaced from the extension 114 such that each of the extensions 108-114 is spaced relative to each other along the front side 104 of the body 102.

The extension 108 includes a downwardly directed flange 116 at the proximal end of the extension 108. The flange 116 extends substantially perpendicularly relative to the extension 108 such that the combination of the extension 108 and the flange 116 is substantially L-shaped. The extension 114 includes an upwardly directed flange 118 at the proximal end of the extension 114. The flange 118 extends substantially perpendicularly relative to the extension 114 such that the combination of the extension 114 and the flange 118 is substantially L-shaped. The flange 118 extends towards the flange 116, and vice versa. The extensions 110, 112 each include a double-sided flange 120, 122 with upwardly and downwardly directed ends extending substantially perpendicularly relative to the extensions 110, 112. The combination of the extensions 110, 112 and the respective flanges 120, 122 define a substantially T-shaped configuration. The facing ends of the respective flanges 116-122 are spaced from each other to define gaps 124 which can either be linearly oriented or angled relative to a horizontal plane. The cantilever formation of the extensions 108-114 allows for at least partial flexing of the flanges 116-122 away from each other to enlarge the respective gaps 124, permitting insertion of cable(s) through the gaps 124 and into the space defined between the extensions 108-114 and flanges 116-122.

Figure 7:
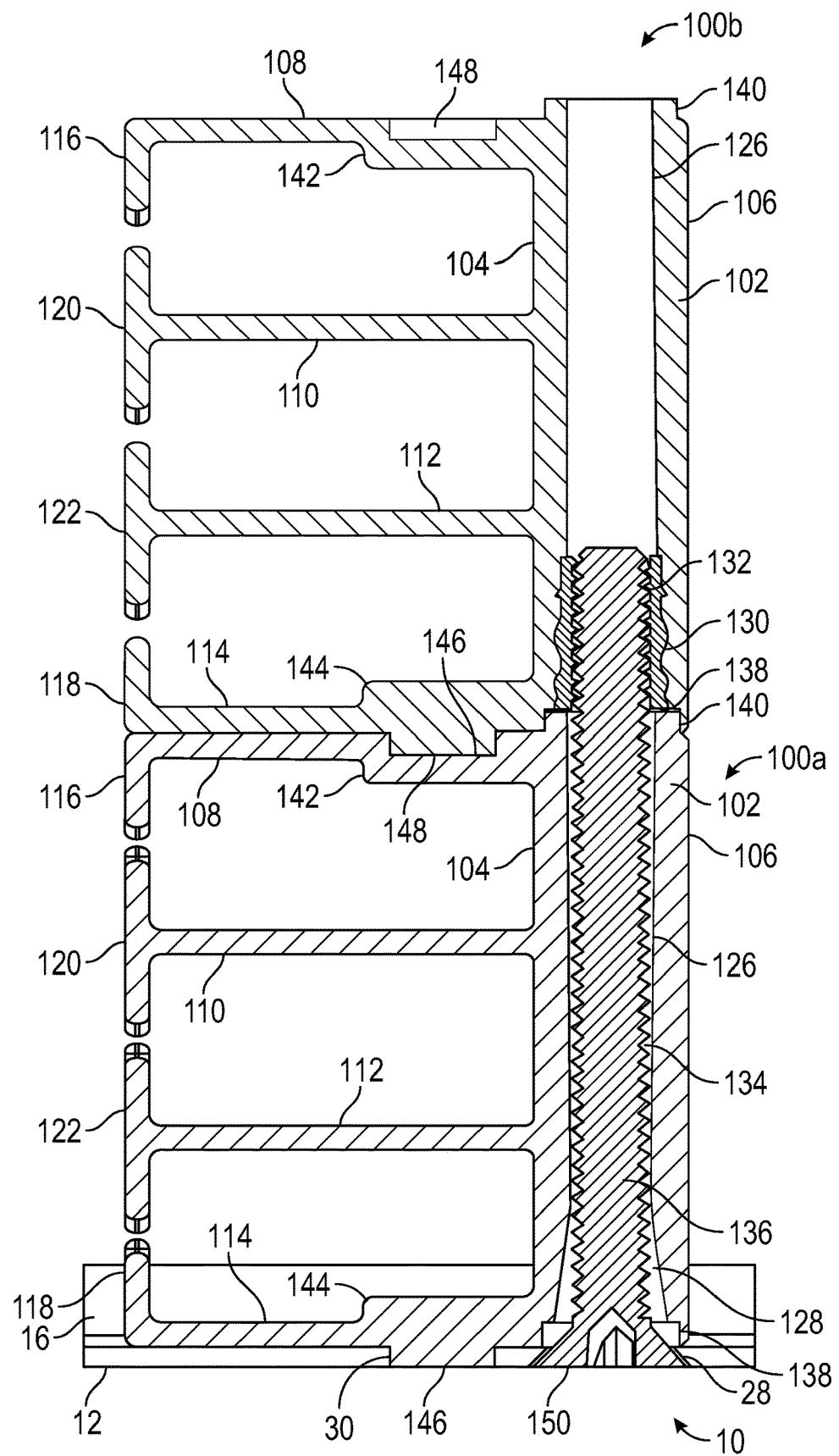
FIG. 7 is a cross-sectional side view of a modular cable management device assembly detachably coupled to a media patching system in an exemplary embodiment.

As illustrated in FIG. 6, the body 102 includes a substantially circular, hollow opening 126 extending through the body 102 from the top surface to the bottom surface. In some embodiments, the opening 126 can define a substantially uniform diameter the entire height of the body 102. In some embodiments, as illustrated in FIG. 7, the opening 126 can have a gradually increasing diameter (e.g., a tapered section 128) at or near the bottom surface of the body 102. The body 102 can include a recessed section 138 aligned with the opening 126 at the bottom surface of the body 102. The recessed section 138 defines a diameter or width dimensioned greater than the diameter of the opening 126. In some embodiments, the recessed section 138 can define a substantially hexagonal shape complementary in shape and height/depth to a keying feature 140 extending from the top surface of the body 102 (e.g., a molded protrusion). In some embodiments, the recessed section 138 and the keying feature 140 can define any complementary configuration, e.g., circular, square, rectangular, triangular, pentagonal, hexagonal, or the like. In some embodiments, the depth of the recessed section 138 can be dimensioned slightly greater than the height of the keying feature 140, and the depth of the recessed section 138 can be dimensioned slightly less than the thickness of the base 12 of the media patching system 10. The dimensional difference between these elements can be as small as possible, while still allowing for easy clearance during assembly.

The opening 126 is configured to receive an insert 130 therein at or near the bottom surface of the body 102. In some embodiments, the insert 130 can be pressed and heat set within the opening 126. The insert 130 includes a threaded opening 132 for engagement with threads 134 of a fastener 136. The insert 130 can be fabricated from a metal material to allow for repeated engagement with threads 134 of the fastener 136. As illustrated in FIG. 6, the bottom end of the insert 130 is offset from the bottom surface of the body 102. For example, the bottom end of the insert 130 can be positioned within the opening 126 and aligned with the innermost surface of the recessed section 138 such that the recessed section 138 remains clear of the insert 130 (i.e., the bottom of the insert 130 is not flush with the bottom surface of the device 100). Such positioning of the insert 130 allows for the recessed section 138 to receive a portion of the head 150 of the fastener 136 and/or the keying feature 140 without obstructions in the hollow space defined by the recessed section 138. The insert 130 is dimensioned to extend only a partial distance into the opening 126. In some embodiments, the insert 130 can be about ¼ inches long, although other lengths of the insert 130 can be used.

In some embodiments, the inner-facing surface (e.g., bottom surface) of the extension 108 and the inner-facing surface (e.g., top surface) of the extension 114 can be planar or flat between the respective flange 116, 118 and the front side 104. In some embodiments, both inner-facing surfaces can include an inwardly facing elevated section 142, 144 that extends partially from the front side 104 towards the respective flange 116, 118. In some embodiments, the width of the elevated section 142, 144 can be dimensioned smaller than the width of the extensions 108, 114. In some embodiments, the length of the elevated section 142, 144 can be about half of the distance between the front side 104 and the respective inner surface of the flange 116, 118. The elevated sections 142, 144 can provide for a thicker section of material at the extensions 108, 114, resulting in greater rigidity and/or structural stability at another keying feature 146 of the device 100.

In particular, the device 100 can include a keying feature 146 in the form of an elongated, rectangular protrusion extending from the bottom surface of the extension 114 (e.g., the bottom surface of the device 100). The keying feature 146 can be centrally aligned with the width of the extension 114, and can be positioned below the elevated section 144. The configuration and/or dimensions of the keying feature 146 can be complementary to the slot 30 formed in the base 12 of the media patching system 10 such that the keying feature 146 can be fully or substantially fully received within the slot 30. (See, e.g., FIGS. 2 and 6). Upon insertion into the slot 30, the keying feature 146 can extend up to (but not beyond) the bottom surface of the base 12. In some embodiments, the height of the keying feature 146 (measured as the distance from the bottom surface of the extension 114) can be dimensioned slightly less than the depth of the slot 30 (i.e., the thickness of the base 12 of the media patching system 10) or the depth of the slot 148 discussed below. The length, width and/or overall shape of the keying features discussed herein can be varied while still achieving the desired function, so long as the keying features and receiving slot remain dimensionally complementary.

The device 100 includes an elongated slot 148 (e.g., a keyhole) formed in the top surface of the extension 108 (e.g., the top surface of the device 100). The slot 148 can be substantially similar to the slot 30 in the base 12 of the media patching system 10, and is configured and dimensioned complementary to the keying feature 146. The slot 148 can be centrally aligned with the width of the extension 108 and is formed above the elevated section 142. The position of the slot 148 is therefore aligned with the position of the keying feature 146, as seen in FIG. 6. As discussed below, the combination of the keying feature 146 and the slot 148 allows for stacking and engagement of the devices 100, permitting use of the device in 1U, 2U, 4U, and other customizable configurations.

As illustrated in FIGS. 2-6, during installation, the keying feature 146 of the device 100 is aligned with and at least partially inserted into the slot 30 of the base 12 at the location of the base 12 where installation of the device 100 is desired. Such engagement of the keying feature 146 with the slot 30 automatically aligns (or substantially aligns) the central longitudinal axis of the opening 126 with the opening 28 of the base 12. The end of the fastener 136 with the threads 134 can be inserted into the opening 28 and the head 150 of the fastener 136 can be used to engage the threads 134 with the threaded opening 132 of the insert 130.

In some embodiments, the fastener 136 can be a tapered or countersunk type of fastener 136 (e.g., a flathead screw or bolt) complementary to the countersunk opening 28 of the base 12. The top of the head 150 therefore substantially aligns and is flush with the bottom surface of the base 12 after complete engagement with the insert 130. Tightening of the fastener 136 relative to the insert 130 pulls the keying feature 146 further into the slot 130, ensuring two points of coupling between the device 100 and the base 12. Such connection provides for a stronger coupling between the device 100 and the base 12, preventing undesired wobbling or movement of the device 100 after installation. In particular, the engagement of the keying feature 146 with the base 12 in combination with the fastener 136 securing the device 100 to the base 12 prevents movement in all directions (i.e., three axis movement is prevented).

Figure 8:
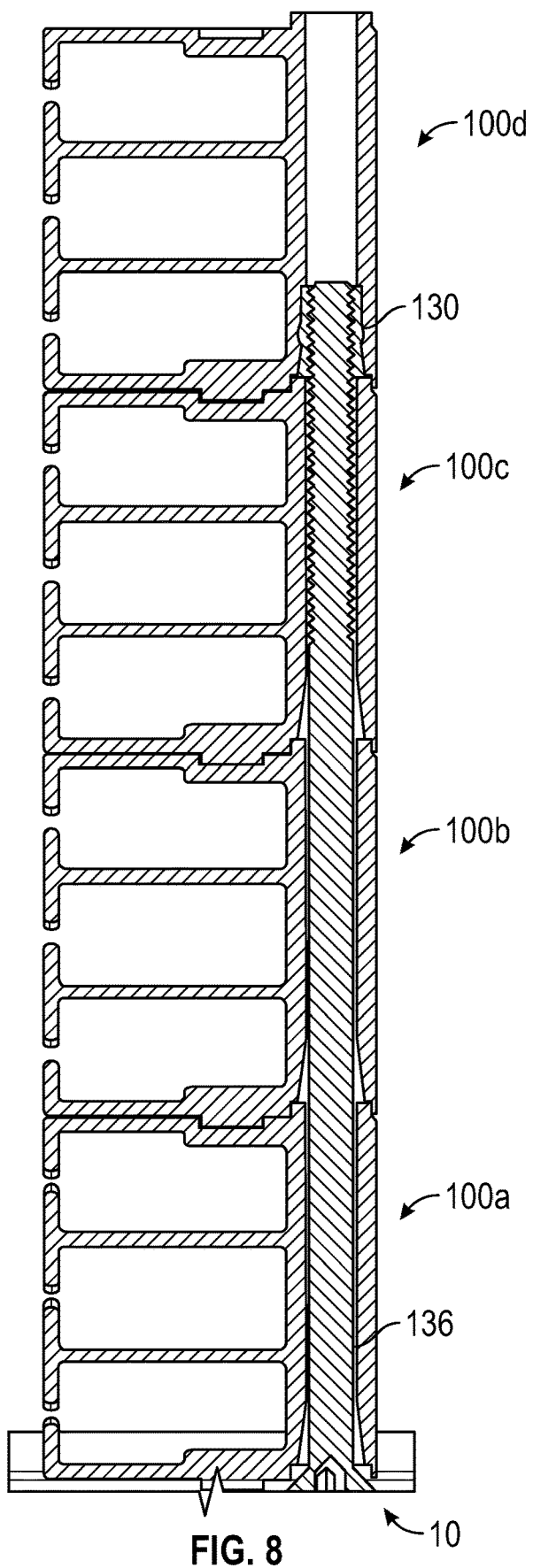
FIG. 8 is a cross-sectional side view of a modular cable management device assembly detachably coupled to a media patching system in an exemplary embodiment.

FIGS. 7 and 8 illustrate the stacking ability of the device 100, such that the device 100 can be used in a 1U configuration (see FIG. 6), a 2U configuration (see FIG. 7), or a 4U configuration (see FIG. 8). For example, FIG. 7 shows devices 100a, 100b stacked relative to each other to form the 2U configuration, and FIG. 8 shows devices 100a, 100b, 100c, 100d stacked relative to each other to form the 4U configuration.

For installation, the keying feature 146 of the bottommost device 100a is aligned with and inserted into the slot 30 in the base 12. The keying feature 146 of the next device 100b is aligned with and inserted into the slot 148 in the top surface of the device 100a. In addition to the engagement of the keying feature 146 and the slot 148, the keying feature 140 extending from the top surface of the device 100a is aligned with and inserted into the recessed section 138 of the device 100b to provide a secondary coupling/engagement section. Engagement of the keying feature 140 with the recessed section 138 assists with prevention of rotation of the device 100b relative to device 100a. The desired number of devices 100 can be stacked in this manner.

Only the uppermost device 100 in the stacked configuration includes the insert 130. A fastener 136 with the appropriate length is selected, and passed through the opening 28 in the base 12 and the openings 126 in the devices 100 until threaded engagement with the insert 130 is possible. Tightening of the fastener 136 relative to the insert 130 pulls the devices 100 together and against the base 12, and pulls the engaged keying features 146, 140 with the slot 148 and recessed section 138, respectively. The result is multiple points of coupling between the devices 100, ensuring a play or wobble free connection that feels like a single piece construction.

Figure 9:
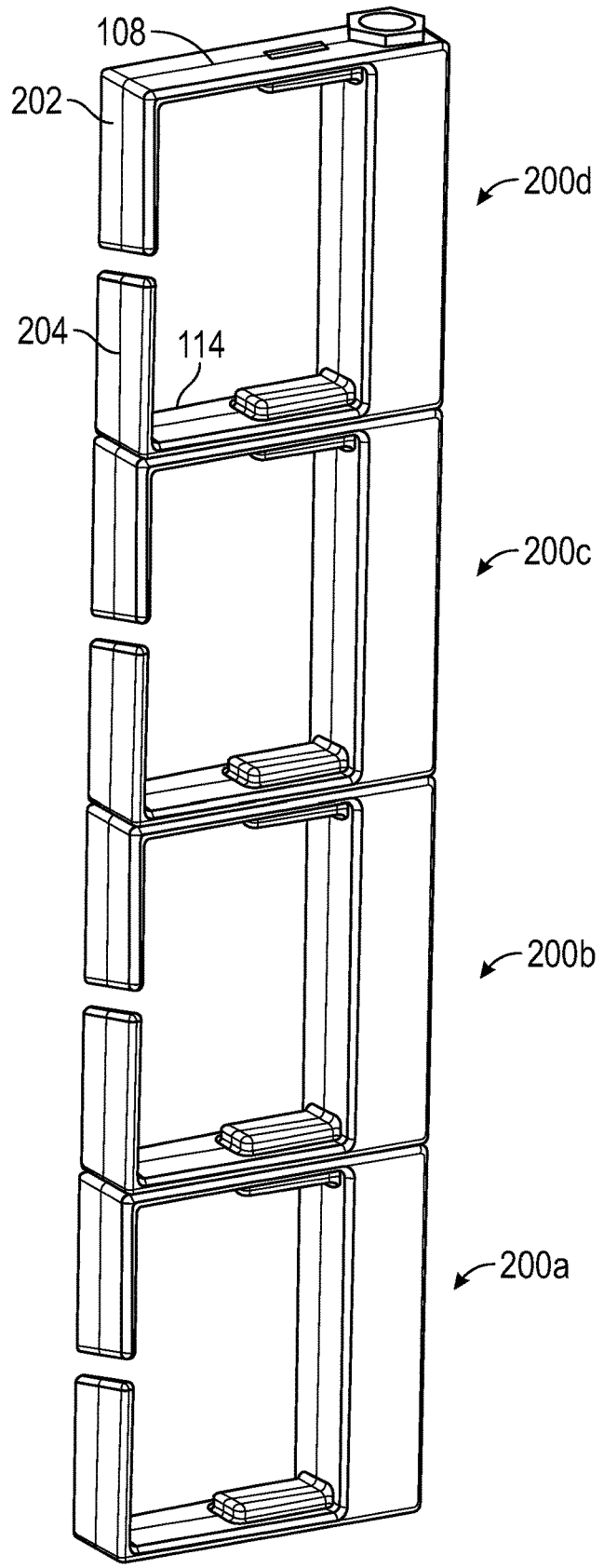
FIG. 9 is a perspective view of a modular cable management device assembly in an exemplary embodiment.
Figure 10:
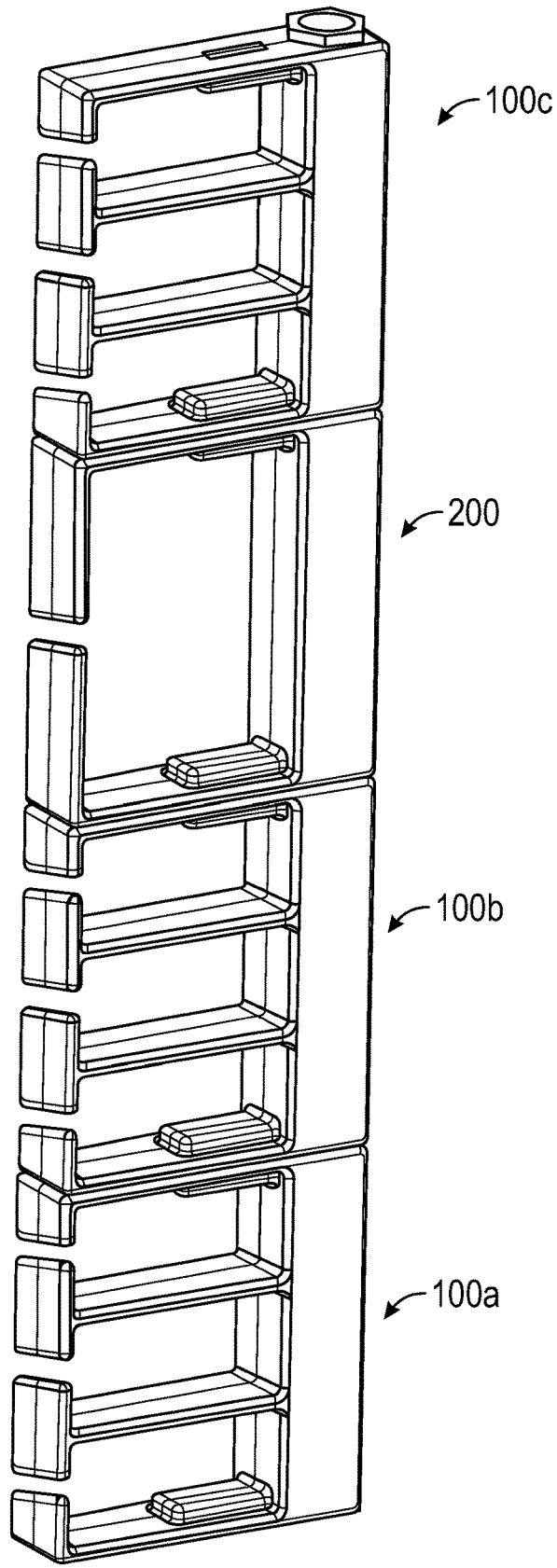
FIG. 10 is a perspective view of a modular cable management device assembly in an exemplary embodiment.

The modular construction of the devices 100 allows for interchangeability of devices 100 having different configurations. For example, as illustrated in FIG. 9, rather than including four extensions 108-114 and four flanges 116-122, the devices 200a, 200b, 200c, 200d (collectively referred to as "device 200" or "devices 200") can include only two extensions 108, 114 and two flanges 202, 204 facing each other in a spaced manner. The remaining structure and function of the device 200 can be substantially similar to the device 100. The devices 200 can therefore be similarly stacked relative to each other and mounted relative to the base 12. If different configurations of the devices 100, 200 are desired, the devices 100, 200 can be interchanged (as shown in FIG. 10) and coupled to the base 12 due to their equivalent keying and engagement features. The devices 100, 200 therefore provide for rigid and secure engagement with the media patching system 10, ensuring cables associated with the media patching system 100 will be guided and secured in a stable manner, and further allow for modularity and/or customization based on the needs of the user.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A modular cable management device for a media patching system, the modular cable management device comprising:
   a body defining a top surface, a bottom surface opposing the top surface, a front side, and a rear side opposing the front side;
   an opening formed in the body at the bottom surface and extending into the body, wherein the opening includes features for engagement with a fastener for detachable coupling of the body to the media patching system; and
   extensions protruding from the front side of the body, the extensions defining one or more spaces therebetween.

2. The modular cable management device of claim 1, wherein the opening extends entirely through the body from the bottom surface to the top surface.

3. The modular cable management device of claim 1, wherein the features for engagement include an insert disposed within the opening at or near the bottom surface of the body.

4. The modular cable management device of claim 3, wherein the insert includes a threaded opening with threads complementary to threads of the fastener for detachable coupling of the body to the media patching system.

5. The modular cable management device of claim 1, wherein the body includes a recessed section formed in the bottom surface of the body, a central longitudinal axis of the recessed section aligned with a central longitudinal axis of the opening formed in the body.

6. The modular cable management device of claim 5, wherein the recessed section defines a hexagonal configuration.

7. The modular cable management device of claim 5, wherein the body includes a first keying feature extending from the top surface of the body, a central longitudinal axis of the first keying feature aligned with a central longitudinal axis of the opening formed in the body.

8. The modular cable management device of claim 7, wherein the first keying feature defines a hexagonal extension.

9. The modular cable management device of claim 7, wherein the first keying feature is complementary to the recessed section.

10. The modular cable management device of claim 1, wherein the extensions include a first extension protruding perpendicularly from the front side of the body at or near the top surface of the body, and a second extension protruding perpendicularly from the front side of the body at or near the bottom surface of the body.

11. The modular cable management device of claim 10, comprising a second keying feature extending perpendicularly from a bottom surface of the second extension.

12. The modular cable management device of claim 11, wherein the second keying feature defines an elongated, rectangular shape configured to be received by a complementary slot in the media patching system.

13. The modular cable management device of claim 11, comprising an elongated slot formed in a top surface of the first extension, the elongated slot is complementary to the second keying feature.

14. The modular cable management device of claim 10, wherein the extensions include a third extension and a fourth extension protruding perpendicularly from the front side of the body in a spaced manner relative to the first and second extensions.

15. The modular cable management device of claim 14, wherein each of the extensions includes a flange at a proximal end oriented perpendicularly relative to the extensions, the flanges defining an adjustable gap therebetween for passage of cables associated with the media patching system.

16. A modular cable management system, comprising:
a media patching system including a base, the base including an opening and a slot formed therein; and
a first modular cable management device capable of being detachably coupled to the base of the media patching system, the modular cable management device including:
  a body defining a top surface, a bottom surface opposing the top surface, a front side, and a rear side opposing the front side;
  an opening formed in the body at the bottom surface and extending into the body, wherein the opening includes features for engagement with a fastener for detachable coupling of the body of the first modular cable management device to the media patching system; and
  extensions protruding from the front side of the body, the extensions defining one or more spaces therebetween.

17. The modular cable management system of claim 16, comprising a second modular cable management device stacked on the first modular cable management device, the second modular cable management device including a body and an opening formed in the body at a bottom surface of the second modular cable management device, the opening extending into the body of the second modular cable management device.

18. The modular cable management system of claim 17, wherein:
in the stacked configuration, the opening of the second modular cable management device is aligned with the opening of the first cable management device;
the system comprises a fastener extending through the opening of the media patching system, extending through the opening in the first modular cable management device, and at least partially extending into the opening in the second modular cable management device; and
the fastener is engaged with features within the opening in the second modular cable management device to couple the first and second modular cable management devices to each other and to the media patching system.

19. A method of cable management on a media patching system, the method comprising:
positioning a modular cable management device on a base of a media patching system, the media patching system including an opening formed therein, and the modular cable management device including:
  a body defining a top surface, a bottom surface opposing the top surface, a front side, and a rear side opposing the front side;
  an opening formed in the body at the bottom surface and extending into the body; and
  extensions protruding from the front side of the body, the extensions defining one or more spaces therebetween;
extending a fastener through the opening formed in the media patching system and into the opening formed in the body of the modular cable management device; and
engaging features within the opening formed in the body of the modular cable management device with the fastener to detachably couple the modular cable management device to the base of the media patching system.

\* \* \* \* \*